United States Patent
Koga et al.

(10) Patent No.: US 7,482,808 B2
(45) Date of Patent: Jan. 27, 2009

(54) SUPERCONDUCTIVE MAGNET APPARATUS AND MAGNETIC RESONANCE IMAGING APPARATUS

(75) Inventors: Yasunori Koga, Hitachi (JP); Hiroyuki Watanabe, Hitachi (JP)

(73) Assignees: Hitachi, Ltd., Tokyo (JP); Hitachi Medical Corporation, Tokyo (JP)

( * ) Notice: Subject to any disclaimer, the term of this patent is extended or adjusted under 35 U.S.C. 154(b) by 0 days.

(21) Appl. No.: 10/785,947

(22) Filed: Feb. 26, 2004

(65) Prior Publication Data

US 2004/0169515 A1 Sep. 2, 2004

(30) Foreign Application Priority Data

Feb. 28, 2003 (JP) ............... 2003-052246

(51) Int. Cl.
*G01V 3/00* (2006.01)

(52) U.S. Cl. ................ 324/318; 324/322

(58) Field of Classification Search ......... 324/300–322, 324/248; 335/299; 62/6; 600/407–455
See application file for complete search history.

(56) References Cited

U.S. PATENT DOCUMENTS

| | | | | |
|---|---|---|---|---|
| 5,361,054 A | | 11/1994 | Kniittel | ............ 335/216 |
| 5,381,666 A | * | 1/1995 | Saho et al. | ............ 62/47.1 |
| 6,011,456 A | * | 1/2000 | Eckels et al. | ............ 335/300 |
| 6,154,110 A | * | 11/2000 | Takeshima | ............ 335/299 |
| 6,343,475 B1 | * | 2/2002 | Ishikawa | ............ 62/6 |
| 6,396,376 B1 | * | 5/2002 | Laskaris et al. | ............ 335/299 |
| 6,438,990 B1 | * | 8/2002 | Hertling | ............ 62/434 |
| 6,504,373 B2 | * | 1/2003 | Tsuda | ............ 324/322 |
| 6,563,312 B2 | * | 5/2003 | Saho et al. | ............ 324/248 |
| 6,717,408 B2 | | 4/2004 | Minas et al. | |
| 6,807,812 B2 | * | 10/2004 | Lehmann et al. | ............ 62/47.1 |

FOREIGN PATENT DOCUMENTS

| | | |
|---|---|---|
| EP | 0 774 670 A1 * | 11/1995 |
| EP | 1 371 328 A1 * | 9/2002 |
| EP | 1371328 | 12/2003 |
| JP | 4-225503 | 8/1992 |
| JP | 11-16718 | 1/1999 |
| JP | 2002-336216 | 11/2002 |
| WO | WO02/071942 | 9/2002 |

* cited by examiner

*Primary Examiner*—Brij B Shrivastav
(74) *Attorney, Agent, or Firm*—Mattingly, Stanger, Malur & Brundidge, P.C.

(57) ABSTRACT

A cryostat is formed into a donut form, where a cylindrical or a square concave is formed in the center of the cryostat of the superconductive magnet apparatus for an open type MRI apparatus, and the cryo-compressor is disposed in the concave.

16 Claims, 6 Drawing Sheets

SUPERCONDUCTIVE MAGNET APPARATUS AND MAGNETIC RESONANCE IMAGING APPARATUS

DESCRIPTION OF THE INVENTION

1. Field of the Invention

The present invention relates to a superconductive magnet apparatus and a magnetic resonance imaging apparatus (hereinafter referred to as MRI) using the magnet apparatus, and more particularly to a superconductive magnet apparatus and a MRI apparatus using the same that does not give feeling of blockade to human bodies to be examined or inspected.

2. Related Art

One example of a superconductive magnet apparatus used for a MRI apparatus is disclosed in Japanese Patent Laid-open Hei 04-225503 (hereinafter referred to as Reference 1). The superconductive magnet apparatus disclosed in the reference 1 is a cylindrical and a horizontal magnetic field type MRI apparatus, wherein a cryostat has a central hollow in which a cryo-compressor is disposed. The cryostat is constituted by a housing or a vacuum vessel covering the magnet.

Further, an apparatus disclosed in Japanese Patent Laid-open Hei 11-16718 (hereinafter referred to as reference 2) has a cryo-compressor for cooling a cooling medium, the cryo-compressor being placed on a vacuum vessel.

However, the superconductive magnet apparatus disclosed in the reference 1 is not an apparatus of a vertical magnet field system that is the subject of the present invention. The apparatus of the reference 1 is a cylindrical type of a horizontal magnetic field, which is different from the apparatus of the present invention in application direction of magnetic field, and an arrangement construction of superconductors, etc. The reference 1 does not disclose the arrangement of the cryo-compressor for the vertical magnetic field system that is the subject of the present invention.

Further, the superconductive magnet apparatus disclosed in the reference 2 is concerned with the vertical magnetic field system, wherein the cryo-compressor for cooling the cooling medium is placed on the vacuum vessel so that the superconductive magnet apparatus becomes large in its height as a whole.

SUMMARY OF THE INVENTION

The present invention aims at solving the above-mentioned problem, and an object of the present invention is to provide a superconductive magnet apparatus and a MRI apparatus that exhibit a sufficiently high refrigeration performance and are small in their overall sizes.

In order to solve the above-mentioned-problem, the present invention is featured in that the superconductive magnet and the cryo-compressor disposed in superconductive coils that cools the cooling medium is placed in a concavity formed at a position where an experience magnetic field is weak. In the specification, the words "experience magnetic field" means a magnetic field strength at a position where a magnetic object is placed; i.e. the magnetic strength felt by the coil, the cooling medium, etc.

DETAILED DESCRIPTION OF THE PREFERRED EMBODIMENTS

In the following, the embodiments of the present invention will be explained by reference to the drawings.

First Embodiment

Figure 7:
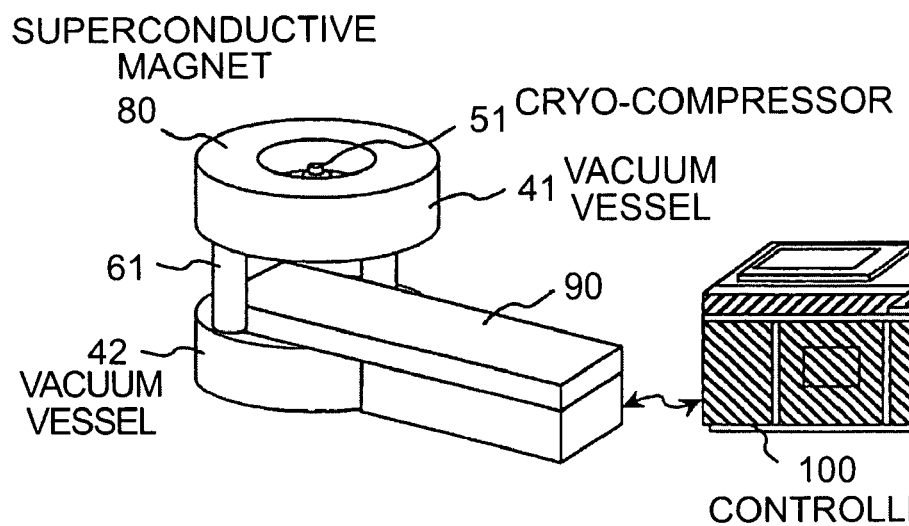
FIG. 7 is a perspective view of a magnetic resonance imaging apparatus that employed the superconductive magnet apparatus according to the present invention.

First of all, an outline structure of the MRI according to the present invention will be explained. The MRI apparatus comprises, as shown in FIG. 7, superconductors (not shown), coil containers (not shown) for accommodating the coils and a cooling medium, vacuum vessels 41, 42 covering the coil containers and being evacuated to be vacuum, a superconductive magnet 80 comprising the cryo-compressor 51 for cooling the cooling medium, a bed or table 90 for supporting a human body or other bodies to be inspected or examined, and a controller 100 for analyzing signals from the body, wherein the vacuum vessels 41, 42 are so disposed as to face each other and to form a vertical magnetic field therebetween, so that the tomography of the body on the bed or table is carried out.

The embodiment of the present invention used in the above-mentioned MRI apparatus will be explained in the following.

Figure 1:
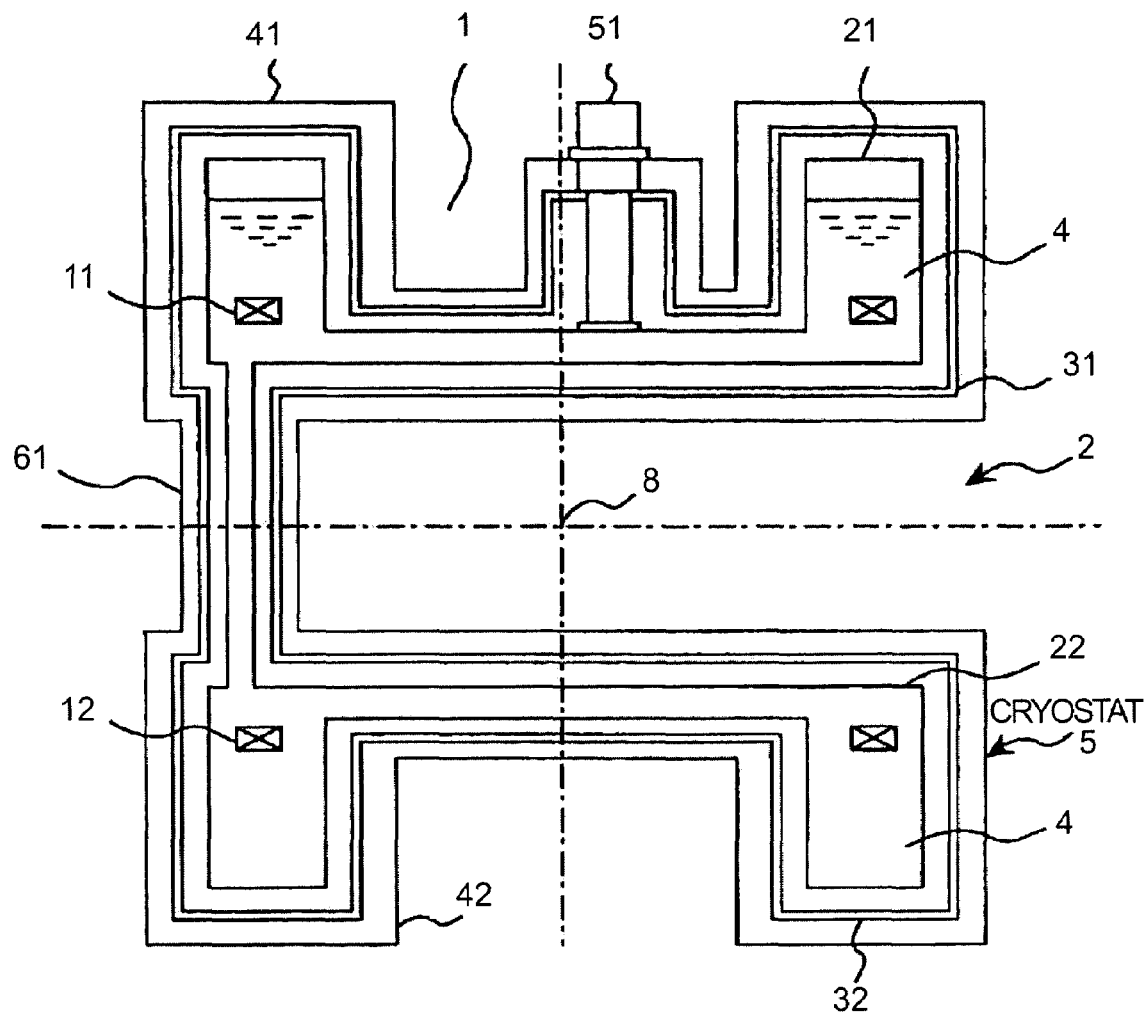
FIG. 1 is a sectional view of an embodiment of a superconductive magnet apparatus according to the present invention.

The first embodiment of the present invention is shown in FIG. 1. In this embodiment, the coil containers 21, 22 function as tanks or containers for accommodating the cooling medium. There are disposed thermal shields 31, 32 for covering the coil containers 21, 22; and a cryostat 5 comprising the vacuum vessels 41, 42 covers the thermal shields 31, 32 to keep the cold of the cooling medium. The cryostat is constituted by the vacuum vessels 41, 42, He container 21, 22, etc. The concavity 1 is formed at the upper portion of the cryostat. The vacuum vessels are communicated with each other via a passage 61. A lateral or horizontal bore or hollow space 2 is formed in the. center of the cryostat 5. A human body or other bodies to be examined or inspected is placed in the bore 2. A magnetic field space is formed in the bore 2 or space 2 between the coil containers. The magnetic field center is located at the center of the bore between the magnets. The cryo-compressor 51 for cooling the cooling medium 4 is disposed via a cryo-compressor port 158 in the cylindrical or square concavity 1 formed at the center of the cryostat, the cryo-compressor being disposed along the vertical direction. The upper and lower coil containers 21, 22 are communicated with each other via a connecting passage 61 through which the cooling medium passes.

When the cryo-compressor 51 is disposed along the vertical direction, the cooling medium 4 filled therein is cooled effectively, so that the efficiency of the cryo-compressor becomes high.

Further, there is formed an appropriate opening in the cryostat 5, and a cooling stage of cryo-compressor (the cold heads) at the lower temperature side is disposed in the coil container 21 so as to cool directly liquid helium. An embodiment of the cryo-compressor will be explained later.

According to the above-mentioned structure, it is possible to make a compact structure without increasing the height of the MRI apparatus, because the cryo-compressor 51 is placed vertically in the concavity 1 formed in the center of the cryostat. Further, when a lid is fitted to the concavity where the cryo-compressor is placed, noise generated from the cryo-compressor 51 is isolated to make the apparatus silent.

Second Embodiment

Figure 2:
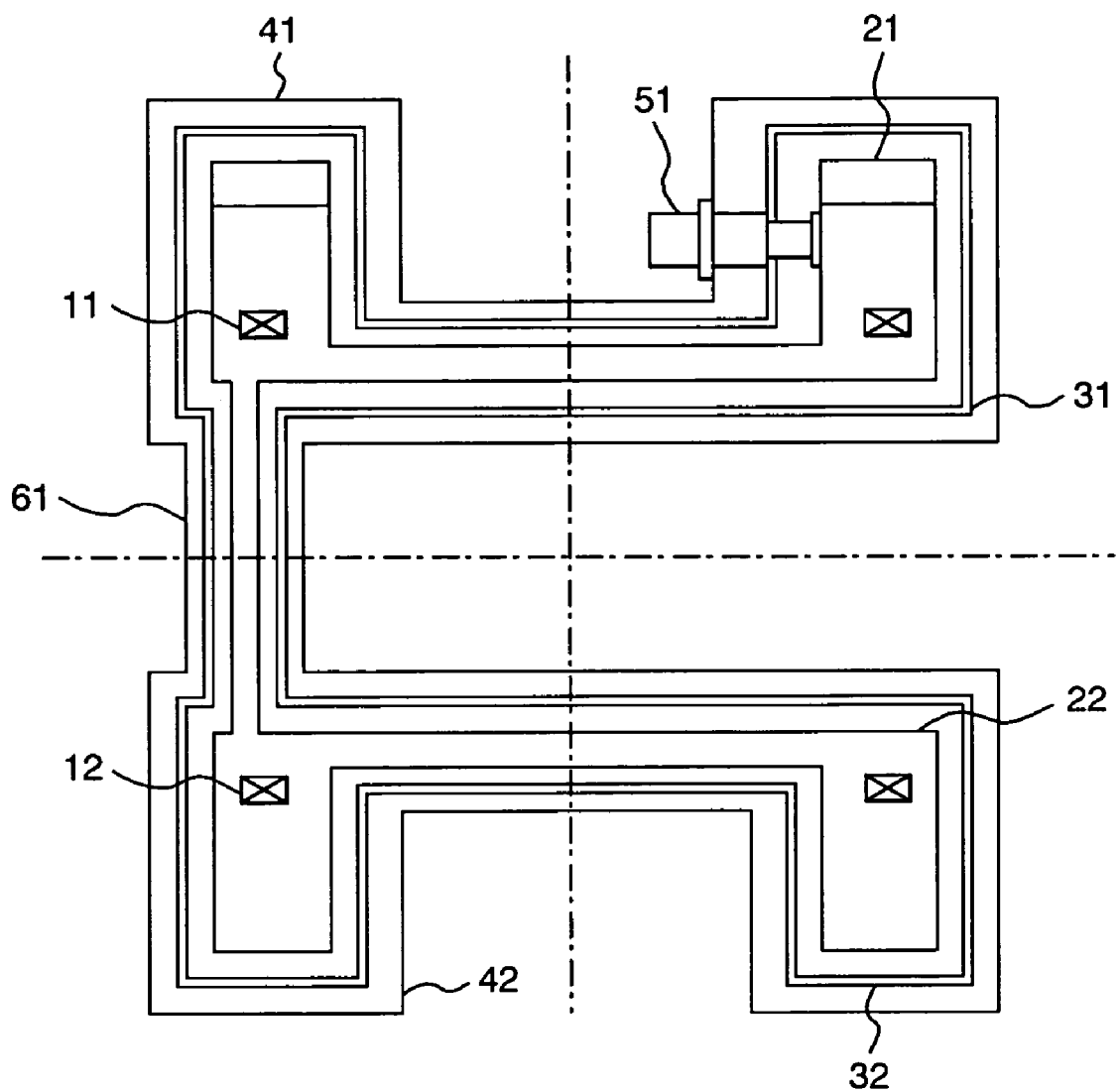
FIG. 2 is a sectional view of another embodiment of the superconductive magnet apparatus according to the present invention.

The second embodiment of the present invention is shown in FIG. 2. In this embodiment, the cryo-compressor 51 that is disposed in the vertical direction in the embodiment 1 is placed in the lateral direction. In this structure, since it is possible to make smaller the height of the cryo-compressor than the cryostat 5, the height of the cryostat 5 becomes lower than that of the first embodiment so that the MRI apparatus can be made more compact than the first embodiment.

Third Embodiment

Figure 3:
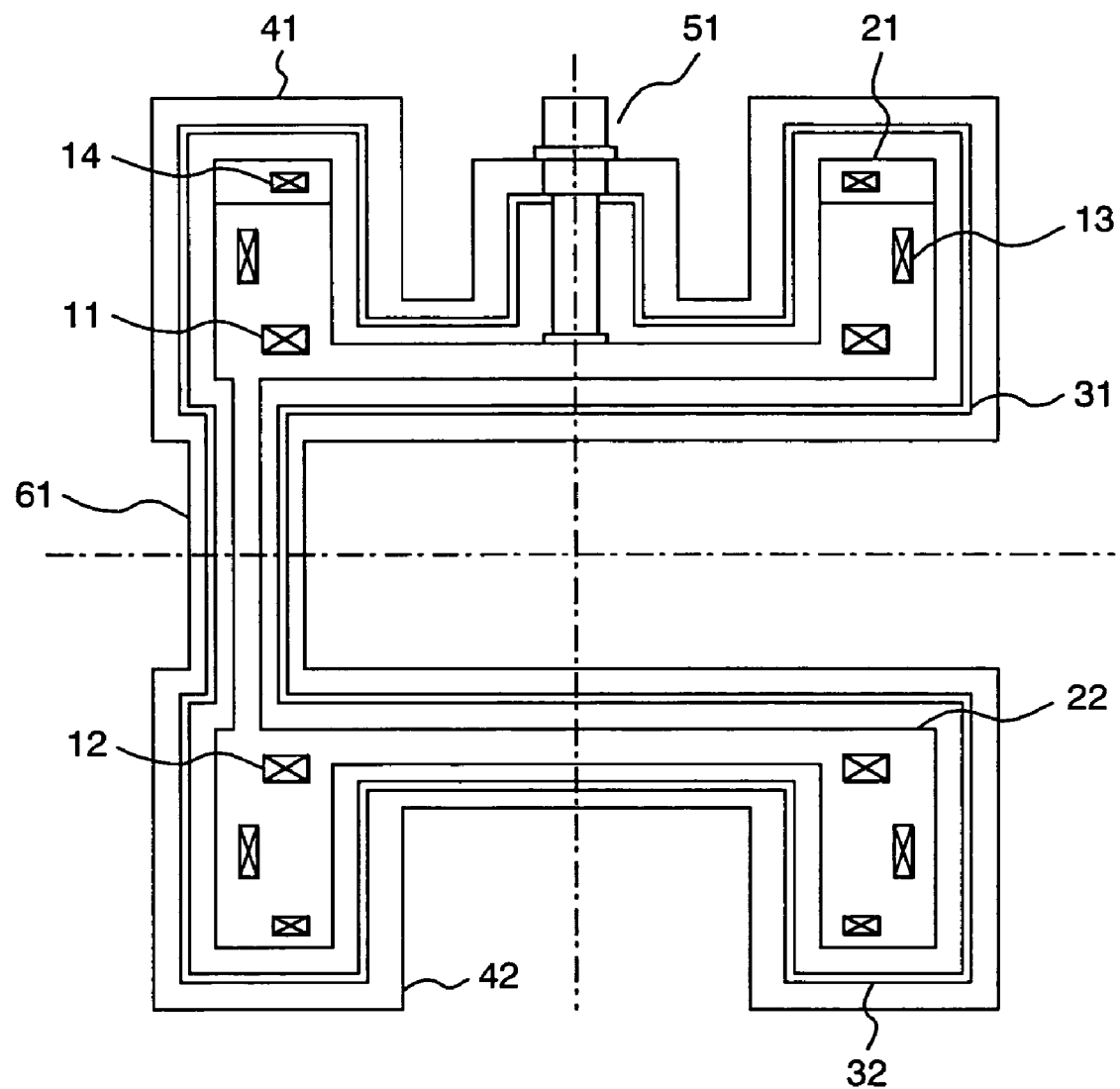
FIG. 3 is a sectional view of another embodiment of the superconductive magnet apparatus according to the present invention.

The third embodiment is shown in FIG. 3. In this embodiment, a superconductive magnet apparatus wherein a superconductive shield coils 13, 14 for active shielding are added to the embodiment 1, the cryo-compressor 51 being disposed in the central axis of the magnet. The shield coils 13, 14 circular superconductors, as same as the superconductive coils, and electric current flowing through the shield coils 13 and current flowing through the shield coil 14 flow in opposite directions. The current flowing through the superconductive coil 11 and the shield coil 14 flows the same direction. Accordingly, the shield coils 13, 14 can shield magnetic force generated from the superconductive coils 11, 12 so that a magnetic field formed outer peripheries of the superconductive coils 11, 12 is not so strong.

According to the above-mentioned structure, if there are not the superconductive coils 13, 14, a strong magnetic field is formed on the central axis of the superconductive coils 11, 12, but the experience on the central axis of the outer peripheries of the superconductive coils 11, 12 by the action of the shield coils 13, 14. As a result, the cryo-compressor 51 can be disposed at a position where the strength of experience magnetic field is weak, so that the performance and reliability of the cryo-compressor 51 can be improved. The cooling medium (especially at the lower temperature stage side) filled in the cryo-compressor 51 lowers its refrigerating efficiency due to worse thermal transferring. efficiency if the experience magnetic field is strong. However, since the cooling medium in the cryo-compressor can be placed at a position where the experience magnetic field is weak according to the present invention, the cooling efficiency of the cryo-compressor can be increased.

Fourth Embodiment

Figure 4:
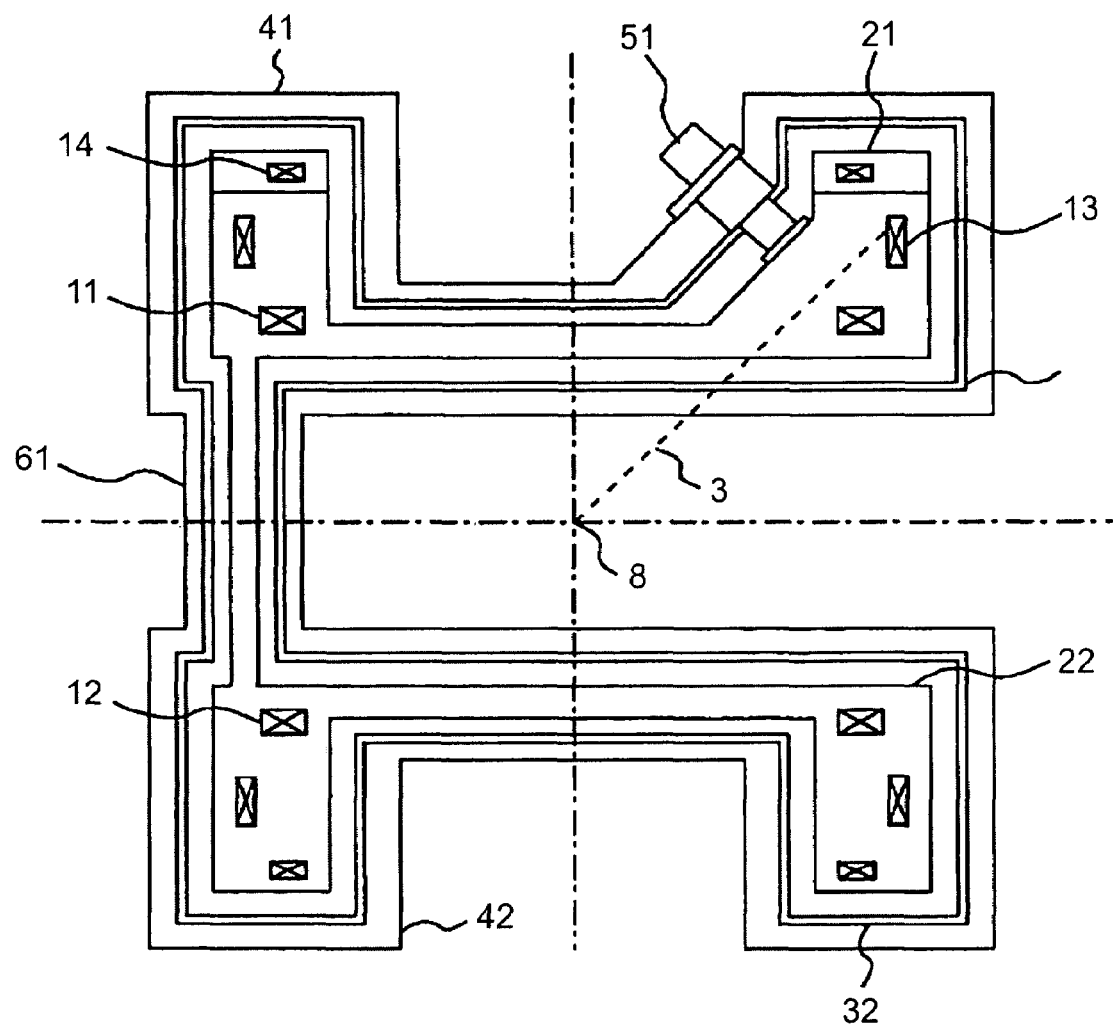
FIG. 4 is a sectional view of another embodiment of the superconductive magnet apparatus according to the present invention.

The fourth embodiment of the present invention is shown in FIG. 4. In this embodiment, the cryo-compressor 51 is disposed in the diagonal direction near the shield coils 13, 14, which are employed in the third embodiment. That is, when the center of the magnetic field space is the crossing point of the dashed lines, and the shield coil 13 is designated, the head of the cryo-compressor is located on the line connecting the center and the shield coil 13. In this structure, since the cryo-compressor 51 can be disposed at a position located between the superconductor 11 and the shield cols 13, 14 where the experience magnetic field is weak, performance and efficiency of the cryo-compressor 51 will be improved, and the height of the cryostat can be shortened to make the MRI apparatus compact.

Further, when the cryo-compressor 51 is pulled out at the time of maintenance, it is necessary to pull out the cryo-compressor 51 along the direction where the lower temperature stage side (cold head) extends. In this embodiment of the present invention where the cryo-compressor 51 is disposed in the diagonal direction, the cryo-compressor 51 can be pulled out without forming a wide space in the portion above the cryostat; thus the maintenance of the apparatus is easy.

Fifth Embodiment

Figure 5:
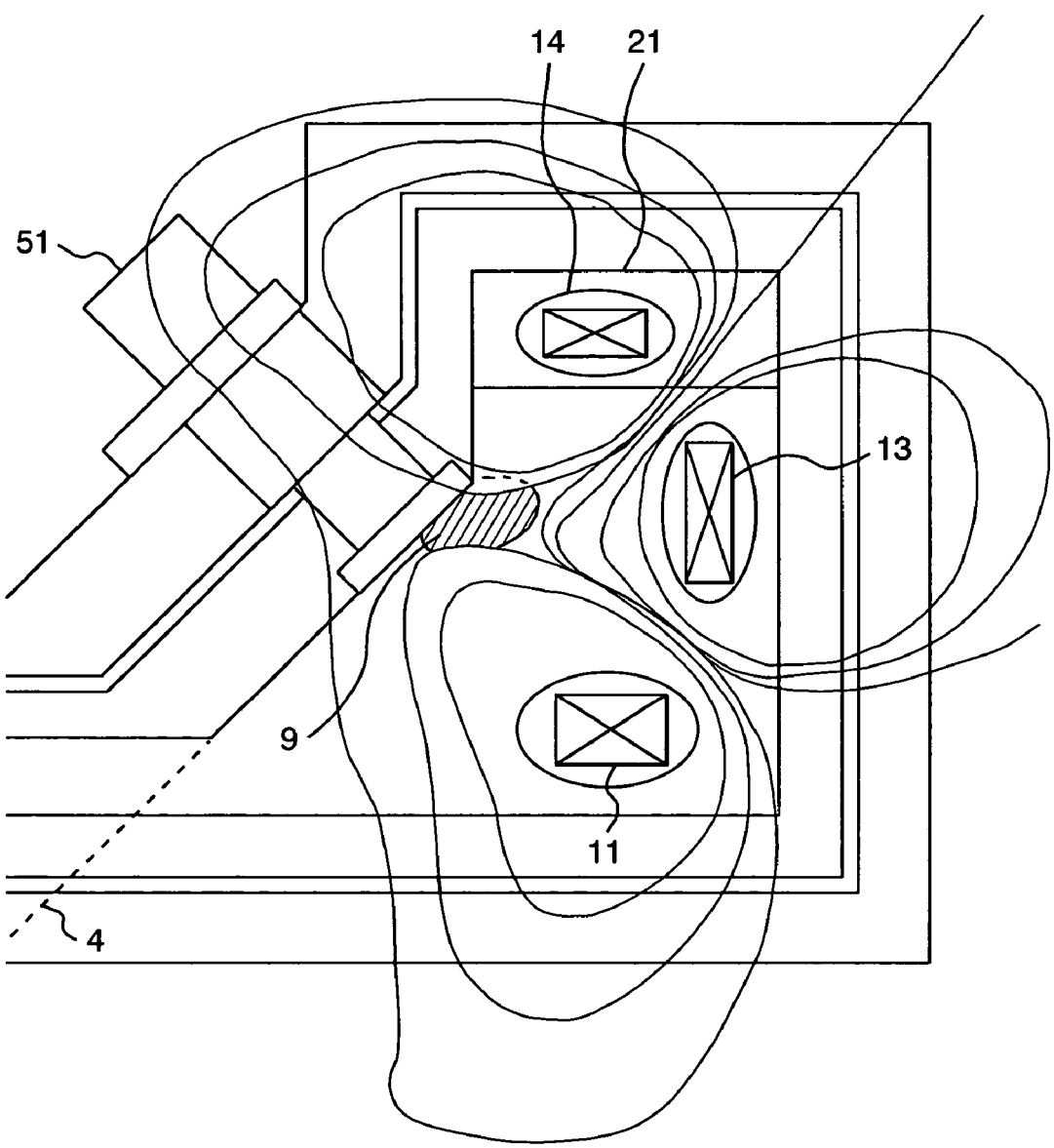
FIG. 5 is a drawing showing the magnetic state in the embodiment in FIG. 4.

FIG. 5 shows the magnetic state around the cryo-compressor 51 employed in the embodiment shown in FIG. 4. In this embodiment, the cryo-compressor 51 is disposed at a position located between the superconductive coils 11, 12 and the shield coils 13, 14 where the strength of the experience magnetic field is weak, and on the path connecting the center 8 of the magnetic space formed by the superconductive coils 11, 12 and the shield coils 13, 14.

As is shown in this magnetic state, the position where the strength of the experience magnetic field is weak is formed in the direction extending of the cryo-compressor 51 by the shield coils 13, 14 for forming active shield. In the conventional case where the cryo-compressor is placed at a position of high experience magnetic field, the efficiency of the cryo-compressor is lowered; however, in the present invention, the MRI apparatus can be operated, keeping a high efficiency of the cryo-compressor, since the cooling medium of the cryo-compressor is placed at a position where the strength of the experience magnetic field is weak.

Sixth Embodiment

Figure 6:
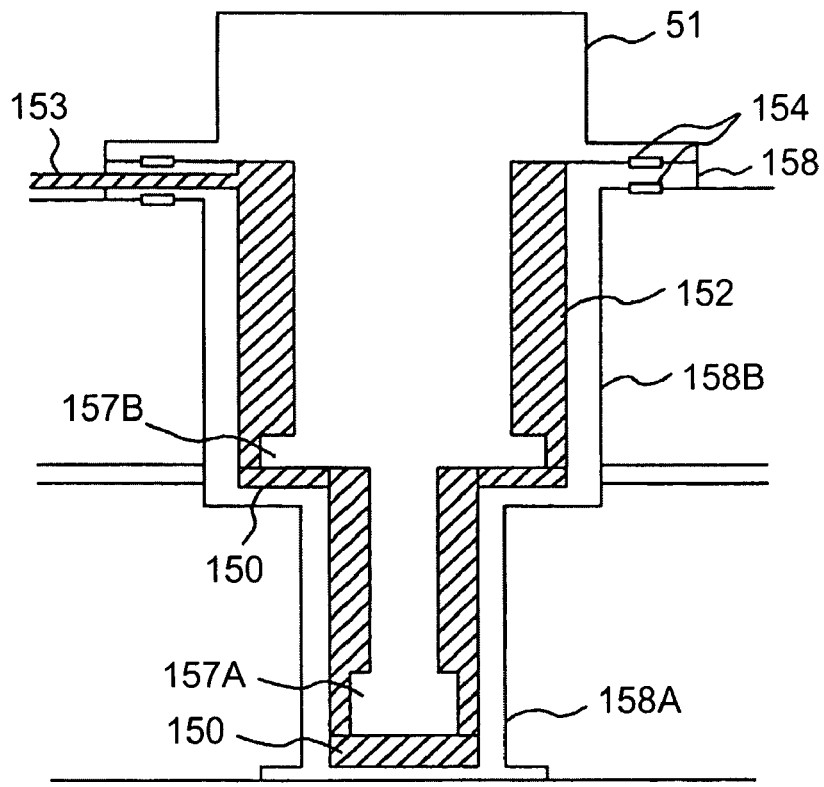
FIG. 6 is a construction figure showing the cryo-compressor used in the present invention.

FIG. 6 shows a sectional view of an example of the structure of the cryo-compressor 51, which is a Gifford-McMahon (GM) type cryo-compressor. A high heat conductive, flexible member 150 is disposed at a part between a cryo-compressor head 158a and a cryo-compressor port 158 so as to transfer cooling heat from the cryo-compressor head to the low temperature side 158a and the middle temperature side 158b of the cryo-compressor port 158. By employing the flexible member, the lower temperature side and the higher temperature side and lower temperature 158a can always contact with the middle temperature side 158b of the cryo-compressor port. As the flexible member 150, high heat conductive materials such as indium, etc. are preferable. Other materials than indium, fibers of copper or aluminum, etc. can be used in a combined form, which has good flexibility, whereby thermal contact is good. In other words, the high thermal conductive member 150 is disposed at part between the cryo-compressor heads 157am 157b and the cryo-compressor port 158, so that the heat conductivity between the cryo-compressor head and the high temperature section 158a, the low temperature section 158b of the cryo-compressor port 158 is increased. Further, since the high thermal conductive material is flexible, the low temperature 157a, middle temperature head 157b, low temperature section 158a, high temperature section 158b of the cryo-compressor can contact each other with high efficiency.

Helium gas 152 is filled in other part between the cryo-compressor head and the cryo-compressor port 158, gas being supplied by way of a gas supply tube 153 and a valve (not shown). An O-ring 154 is disposed as an air-tight sealing.

Helium gas 152 in the cryo-compressor port 158 works to transfer cooling heat by the conductive heat of helium when the high heat conductive, flexible member 150 is peeled off from the cryo-compressor port 158 or heads 157a, 157b. The smaller the gap between the high temperature side and the low temperature side is, the conductive heat becomes larger. In this case, the gap is as small as about 100 micrometers or less. Thus, even if the high conductive, flexible member peels off from the cryo-compressor port or from cryo-compressor head due to thermal shrinkage, the cooling heat is transferred to the shield 31 without problem. Further, when pulling out the cryo-compressor 51 from the cryo-compressor port 158, air does not enter the inside from the cryo-compressor port 158 to prevent freezing, while opening the valve and supplying helium gas from a gas bomb (not shown) into the gap between the cryo-compressor 51 and the cryo-compressor port 158. As soon as the cryo-compressor 51 is pulled out from the cryo-compressor port 158, the upper part of the cryo-compressor port 158 is closed, so as not to prevent air from entering into the inside. When the cryo-compressor 51 is disposed to the cryo-compressor port 158, helium gas can be filled entirely in the cryo-compressor port, while supplying helium gas 152 into the inside of the cryo-compressor 51.

As having being described above, the superconductive magnet apparatus of the present invention has such a structure that the cryo-compressor is easily disposed and dismounted, and that even if the cryo-compressor is out of order, exchange of parts or the cryo-compressor with new parts or new cryo-compressor is conducted.

Further, it is possible to adopt a pulse tube cryo-compressor other than the above-mentioned Gilford-McMahon type (GM) cryo-compressor. And, when the pulse tune cryo-compressor is employed, maintenance is no needed, and then it is possible to construct such a structure that the cooling medium and the cryo-compressor directly contact with each other. Even when these cryo-compressors are employed, it is possible to operate various cryo-compressors at high efficiency, since the cryo-compressors are disposed at a position where the experience magnetic field is weak. The position where the cryo-compressor is disposed is around the area 9 where the magnetic field formed by the main coil 11 and the shield coils 13, 14 is a null-flux area.

According to the embodiments of the present invention that has been described in detail, the cryo-compressor is disposed in the concavity formed at the center of the cryostat so that the size of the apparatus can be made small. Thus, although the ceiling of the room where the NMR apparatus is installed has some limitation, the maintenance of the NMR apparatus can be easy because the height of the magnets becomes very small. Further, since the height of the NMR apparatus is small, human bodies or animals do not feel stress. The maintenance work over the magnets is easy and safer than the conventional apparatus. It is possible to provide a compact open type MRI apparatus. In the specification, the open type NMR apparatus is used to mean that the NMR apparatus has no envelope like the conventional tunnel type NMR apparatus. Thus, the human body or animals feel open-system, and accessibility to the measurement region is good. Normally, the magnet (superconductive magnet or permanent magnet) is divided into two sections, so as to sandwich the table or bed.

Further, according to the present invention, it is possible to provide a MRI apparatus with an improved performance of the cryo-compressor, because the cryo-compressor is disposed at a position where the experience magnetic field is weak.

What is claimed is:

1. A superconductive magnet apparatus, which comprises: a cryostat comprising a pair of ring shaped superconductive coils; a pair of coil containers each including one of the superconductive coils and for accommodating a cooling medium; a pair of thermal shields each covering one of the coil containers; and a pair of vacuum vessels each covering one of the thermal shields, and a cryo-compressor for cooling the cooling medium, wherein the coil containers are disposed so as to face each other, and a magnetic field space is formed in a bore or space between the coil containers, the cryo-compressor being disposed inside of the superconductive coils and within a concavity formed in one of the vacuum vessels of the cryostat.

2. The superconductive magnet apparatus according to claim 1, wherein the cryo-compressor is disposed in parallel with the direction of the magnetic field in the magnetic space.

3. A magnetic resonance imaging apparatus comprising the superconductive magnetic apparatus according to claim 2, a bed or table for carrying a body to be inspected, and a controller for analyzing nuclear magnetic resonance signals from the body, the bed or table being movable between the opposite vacuum vessels of the superconductive magnetic apparatus.

4. The superconductive magnetic apparatus according to claim 1, wherein the cryo-compressor is disposed in a diagonal direction with respect to the direction of the magnetic field in the magnetic space.

5. A magnetic resonance imaging apparatus comprising the superconductive magnetic apparatus according to claim 4, a bed or table for carrying a body to be inspected, and a controller for analyzing nuclear magnetic resonance signals from the body, the bed or table being movable between the opposite vacuum vessels of the superconductive magnetic apparatus.

6. The superconductive magnetic apparatus according to claim 1, wherein the cryo-compressor is disposed in such a position that the strength of an experience magnetic field is low.

7. A magnetic resonance imaging apparatus comprising the superconductive magnetic apparatus according to claim 1, a bed or table for carrying a body to be inspected, and a controller for analyzing nuclear magnetic resonance signals from the body, the bed or table being movable between the opposite vacuum vessels of the superconductive magnetic apparatus.

8. A superconductive magnet apparatus, which comprises: a cryostat comprising a pair of superconductive coils; a pair of coil containers each accommodating one of the coils and a cooling medium; a pair of thermal shields each covering one of the coil containers with a space; and a vacuum vessel for covering the coil containers and the thermal shield, the vacuum vessel being kept at a vacuum; and a cryo-compressor for cooling the cooling medium, wherein the coil containers are so disposed as to face each other to form a magnetic space between the coil containers, characterized in that there is disposed a shield coil for shielding the magnetic field of the superconductive coils, and the cryo-compressor is disposed within a concavity formed in a wall of one of the coil containers near the shield coil and outside the cryostat.

9. The superconductive magnet apparatus according to claim 8, wherein the cryo-compressor is disposed on a path connecting the center of the magnetic space and the shield coils.

10. The superconductive magnet apparatus according to claim 8, wherein the cryo-compressor is disposed at a position where an experience magnetic field strength is weak.

11. A superconductive magnet apparatus, which comprises:

a cryostat comprising a pair of superconductive coils; a pair of coil containers for accommodating each of the superconductive coils and a cooling medium; a pair of thermal shields for covering the coil containers with a space; and a cryo-compressor for cooling the cooling medium, wherein the coil containers are so disposed as to face each other thereby to form a magnetic space between the coil containers, the cryo-compressor being disposed within a concavity outside the cryostat where an experience magnetic strength is weak, the concavity being formed in one of the coil containers.

12. The superconductive magnet apparatus according to claim 11, which further comprises a pair of shield coils for shielding the magnetic field of the superconductive coils, wherein the cryo-compressor is disposed at a position where the experience magnetic strength is weak.

13. A superconductive magnetic apparatus, which comprises:

a cryostat comprising a pair of superconductive coils; a pair of coil containers each accommodating one of the superconductive coils and a cooling medium; a pair of thermal shields each covering one of the coil containers; and a vacuum vessel covering each of the thermal shields, and a cryo-compressor for cooling the cooling medium;

wherein the coil containers are disposed so as to face each other, and a magnetic field space is formed in a bore between the coil containers, the cryo-compressor being disposed within a concavity being formed in a wall of the vacuum vessel of the cryostat outside the cryostat.

14. The superconductive magnetic apparatus according to claim 13, wherein the cryo-compressor is located inside of one of the superconductive coils.

15. The superconductive magnetic apparatus according to claim 13, wherein the cryo-compressor is disposed at a position where an experience magnetic strength is weak.

16. The superconductive magnetic apparatus according to claim 13, wherein the coil containers are characterized in that there is disposed a shield coil for shielding the magnetic field of the superconductive coils, and the cryo-compressor is disposed within the concavity formed in the wall of one of the coil containers near the shield coil.

* * * * *